United States Patent
Pate et al.

(10) Patent No.: US 9,295,152 B2
(45) Date of Patent: Mar. 22, 2016

(54) DEVICE WITH A SINGLE CRYSTAL DIAMOND SUBSTRATE WITH A BURIED ELECTRICALLY CONDUCTING LAYER

(71) Applicants: Bradford B. Pate, Arlington, VA (US); Matthew P. Ray, Bridal Trail, SC (US); Jeffrey W. Baldwin, Fairfax, VA (US)

(72) Inventors: Bradford B. Pate, Arlington, VA (US); Matthew P. Ray, Bridal Trail, SC (US); Jeffrey W. Baldwin, Fairfax, VA (US)

(73) Assignee: The United States of America, as represented by the Secretary of the Navy, Washington, DC (US)

( * ) Notice: Subject to any disclaimer, the term of this patent is extended or adjusted under 35 U.S.C. 154(b) by 0 days.

(21) Appl. No.: 14/686,548

(22) Filed: Apr. 14, 2015

(65) Prior Publication Data

US 2015/0223331 A1    Aug. 6, 2015

Related U.S. Application Data

(62) Division of application No. 13/801,495, filed on Mar. 13, 2013, now Pat. No. 9,040,345.

(51) Int. Cl.

| | |
|---|---|
| H01L 29/15 | (2006.01) |
| H05K 1/09 | (2006.01) |
| H05K 3/46 | (2006.01) |
| H01L 29/16 | (2006.01) |
| B23K 26/00 | (2014.01) |
| B23K 26/06 | (2014.01) |
| B23K 26/36 | (2014.01) |
| B23K 26/40 | (2014.01) |
| C30B 29/04 | (2006.01) |
| C30B 33/02 | (2006.01) |
| H01L 23/373 | (2006.01) |
| H05K 3/00 | (2006.01) |

(52) U.S. Cl.
CPC ............. *H05K 1/09* (2013.01); *B23K 26/0057* (2013.01); *B23K 26/063* (2013.01); *B23K 26/0622* (2015.10); *B23K 26/362* (2013.01); *B23K 26/365* (2013.01); *B23K 26/40* (2013.01); *B23K 26/407* (2013.01); *C30B 29/04* (2013.01); *C30B 33/02* (2013.01); *H01L 29/1608* (2013.01); *H05K 3/4602* (2013.01); *B23K 2201/38* (2013.01); *B23K 2201/40* (2013.01); *B23K 2203/50* (2015.10); *H01L 23/3732* (2013.01); *H01L 29/1602* (2013.01); *H01L 2924/00* (2013.01); *H01L 2924/0002* (2013.01); *H05K 3/0029* (2013.01); *H05K 2201/0323* (2013.01); *Y10S 438/931* (2013.01); *Y10T 428/265* (2015.01); *Y10T 428/30* (2015.01)

(58) Field of Classification Search
CPC .... H05K 1/09; B23K 26/407; B23K 26/0057; B23K 26/063; C30B 29/04; H01L 29/1608; H01L 29/66068; H01L 29/1602; H01L 29/7802; H01L 29/45
USPC ............ 257/77, 621, 620, 627, 774, E33.035, 257/E23.118, E21.054, E21.055, E21.065; 438/105, 463, 467, 931
See application file for complete search history.

(56) References Cited

U.S. PATENT DOCUMENTS 6,423,982 B2 * 7/2002 Nishibayashi ................ 257/328

*Primary Examiner* — Thinh T Nguyen
(74) *Attorney, Agent, or Firm* — US Naval Research Laboratory; Stephen T. Hunnius

(57) ABSTRACT

A device comprising a single crystal diamond substrate with a buried electrically conducting layer with μm square openings spaced apart milled into the diamond by ablating the carbon above wherein the step of ablating uses a diode pumped tripled Nd:YAG laser at 355 nm and wherein the square openings have electrical contacts and wherein the resistance measured between the square openings is dominated by the buried electrically conducting layer and on the order of about 1 kΩ.

8 Claims, 4 Drawing Sheets

DEVICE WITH A SINGLE CRYSTAL DIAMOND SUBSTRATE WITH A BURIED ELECTRICALLY CONDUCTING LAYER

REFERENCE TO RELATED APPLICATION

This application is a non-provisional of, and claims priority to and the benefits of, US Provisional Patent Application 61/613,049 filed on Mar. 20, 2012, and U.S. patent application Ser. No. 13/801,495 filed on Mar. 13, 2013, the entireties of each are hereby incorporated by reference.

BACKGROUND

This disclosure provides for a method for a laser ablation technique for electrical contact to a buried electrically conducting layer in diamond. Furthermore this disclosure provides for a device that has a single crystal diamond substrate with a buried electrically conducting layer between two openings formed by the laser ablation technique and having electrical contacts and wherein the resistance measured between the openings is dominated by the buried electrically conducting layer and on the order of about 1 kΩ.

This disclosure demonstrates a facile method to make low-resistance electrical contact to a buried conducting layer in diamond.

Previous methods for establishing contact to a buried, electrically conducting layer in an otherwise insulating diamond have not overcome the obstacles and have do not produced the superior results of the technique disclosed herein.

One example of a previous method is multiple ion implants into diamond (Prins, 1985). This method for establishing electrical contact to the buried implant layer involves performing a series of ion implants over a range of energies to create a damaged diamond region which extends from the surface to the implant layer. Depending on the depth of the buried layer, this method requires many ion implants. Performing many ion implants is a costly and time-consuming procedure requiring highly specialized equipment and skilled personnel to provide maintenance and operation. Furthermore, using the multiple implant method, the electrical contacts to the buried layer must be established before the buried layer is formed by ion implantation.

A second example of a previous method is a laser damage column (Prawer, 1992). This alternative method establishes electrical contact to the buried layer by creating a column of damaged, electrically conducting diamond which extends from the diamond surface to the buried layer using pulsed focused laser irradiation coupled to a conventional microscope with a 50× objective. If the buried layer is slightly opaque, the laser pulse is selectively absorbed in the buried layer. The laser melts the diamond and this melt front propagates to the surface. Upon cooling, highly conductive columns extend from the surface to the buried layer. A disadvantage of this method is that the columns of damaged, electrically conducting material create relatively large contact resistances to the buried layer.

A third example of a previous method is ion implant over gold beads (Olivero, 2009). This alternative is to scan an ion beam along a linear path which terminates at a semi-spherical mask characterized by a non-uniform thickness profile (Au bead made with ball bonder). As the beam scan progresses towards the center of the mask, incident ions cross an increasing thickness of masking material, thus progressively reducing their range in the diamond layer. After removing the mask, the heavily damaged, electrically conducting diamond can be connected with the surface and the implant layer establishing electrical contact. A disadvantage of this method is that irregularities in the semi-spherical mask create discontinuities in the electrically conducting column such that robust electrical contact between the diamond surface and the buried layer is not reliable.

SUMMARY OF DISCLOSURE

Description

This disclosure provides for a method for a laser ablation technique for electrical contact to a buried electrically conducting layer in diamond. Furthermore this disclosure provides for a device that has a single crystal diamond substrate with a buried electrically conducting layer between two openings formed by the laser ablation technique and having electrical contacts and wherein the resistance measured between the openings is dominated by the buried electrically conducting layer and on the order of about 1 kΩ.

Example

Single crystal diamond substrates were prepared by mechanical polishing. A series of treatments to remove contaminants was also performed. This procedure reduces surface roughness to a small fraction of a nanometer, ensuring that the buried layer has a uniform depth and thickness. At room temperature the diamond was implanted, at 7 degrees to the C(100) axis to avoid ion channeling, with a beam of 180 keV followed by 150 keV $C^+$ ions at fluences of $4 \times 10^{15}$ ions/cm$^2$ and $5 \times 10^{15}$ ions/cm$^2$ respectively. During the implant process the near-surface region of the diamond remains relatively undamaged while a thin (~200 nm), heavily damaged, electrically conducting carbon layer is formed beginning at about 50 nm beneath the diamond surface.

DESCRIPTION OF THE DRAWINGS

The following description and drawings set forth certain illustrative implementations of the disclosure in detail, which are indicative of several exemplary ways in which the various principles of the disclosure may be carried out. The illustrated examples, however, are not exhaustive of the many possible embodiments of the disclosure. Other objects, advantages and novel features of the disclosure will be set forth in the following detailed description when considered in conjunction with the drawings.

MeV, C$^+$) as a function of depth using SRIM. The dashed line is a guide for the eye highlighting the agreement between surface profilometry taken over a electrical contact pad fabricated using the laser ablation technique and ion implantation damage as a function of depth simulated with SRIM. This demonstrates that with tuning of the laser parameters, only the diamond above the implant layer is removed.

Figure 4:
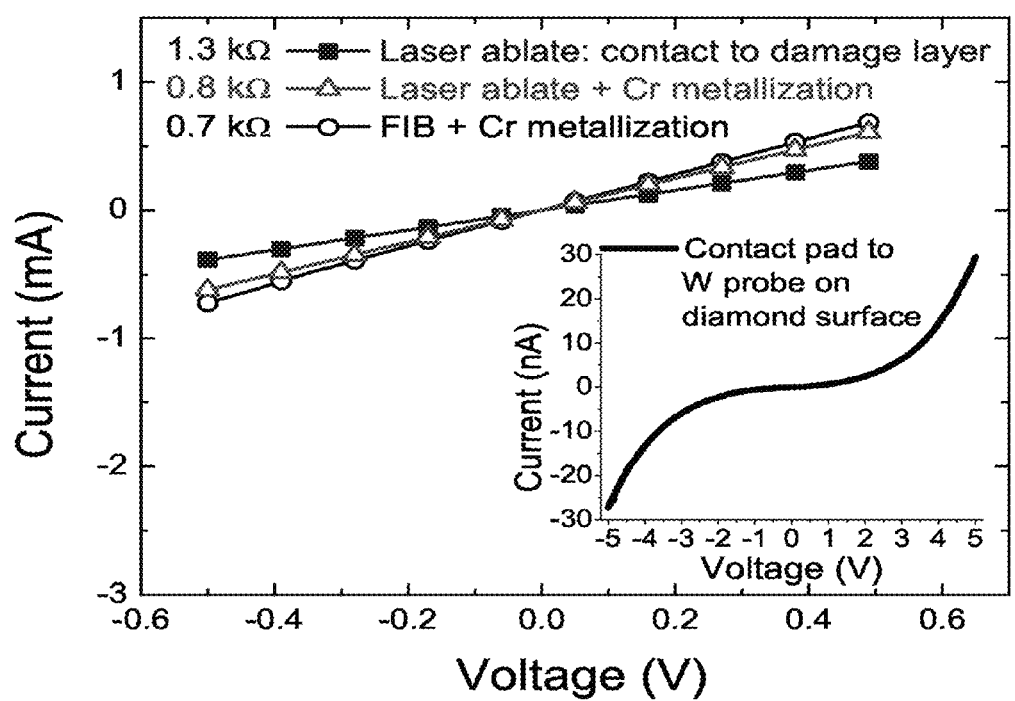

FIG. 4 illustrates I-V measurements between two contacts composed of: damaged carbon produced by the laser machining process; Cr evaporated over the laser damaged carbon; Cr evaporated over focused ion beam fabricated contacts. The inset shows an I-V measurement taken between a laser machined contact pad capped with Cr and a tungsten point contact on the diamond surface.

DETAILED DESCRIPTION OF THE INVENTION

This disclosure provides for a method for a laser ablation technique for electrical contact to a buried electrically conducting layer in diamond. Furthermore this disclosure provides for a device that has a single crystal diamond substrate with a buried electrically conducting layer between two openings formed by the laser ablation technique and having electrical contacts and wherein the resistance measured between the openings is dominated by the buried electrically conducting layer and on the order of about 1 kΩ.

This disclosure demonstrates a facile method to make low-resistance electrical contact to a buried conducting layer in diamond.

The invention disclosed herein ablates the electrically insulating diamond skin which lies over the electrically conducting buried layer providing access for electrical contact. We use laser micro-machining to open an electrical contact through the diamond skin exposing the buried layer.

Optical transmission microscopy of heavily implanted diamond reveals that the buried layer is opaque so that the laser pulse is primarily absorbed in the implant layer. Machining (laser ablation) of the diamond is performed using a diode pumped, tripled Nd:YAG laser (355 nm) (E-Series Laser Micromachining System, Oxford Lasers Ltd., Didcot, UK.) focused 0.5 mm above the diamond surface. Laser output pulses of 17 µJ are defocused to an ~9 µm diameter beam spot. The laser pulse duration is nominally 35 ns with a pulse frequency of 10 kHz. Two 300×300 µm square openings spaced 2.45 mm apart are milled into the diamond skin (see FIG. 1).

Figure 1:
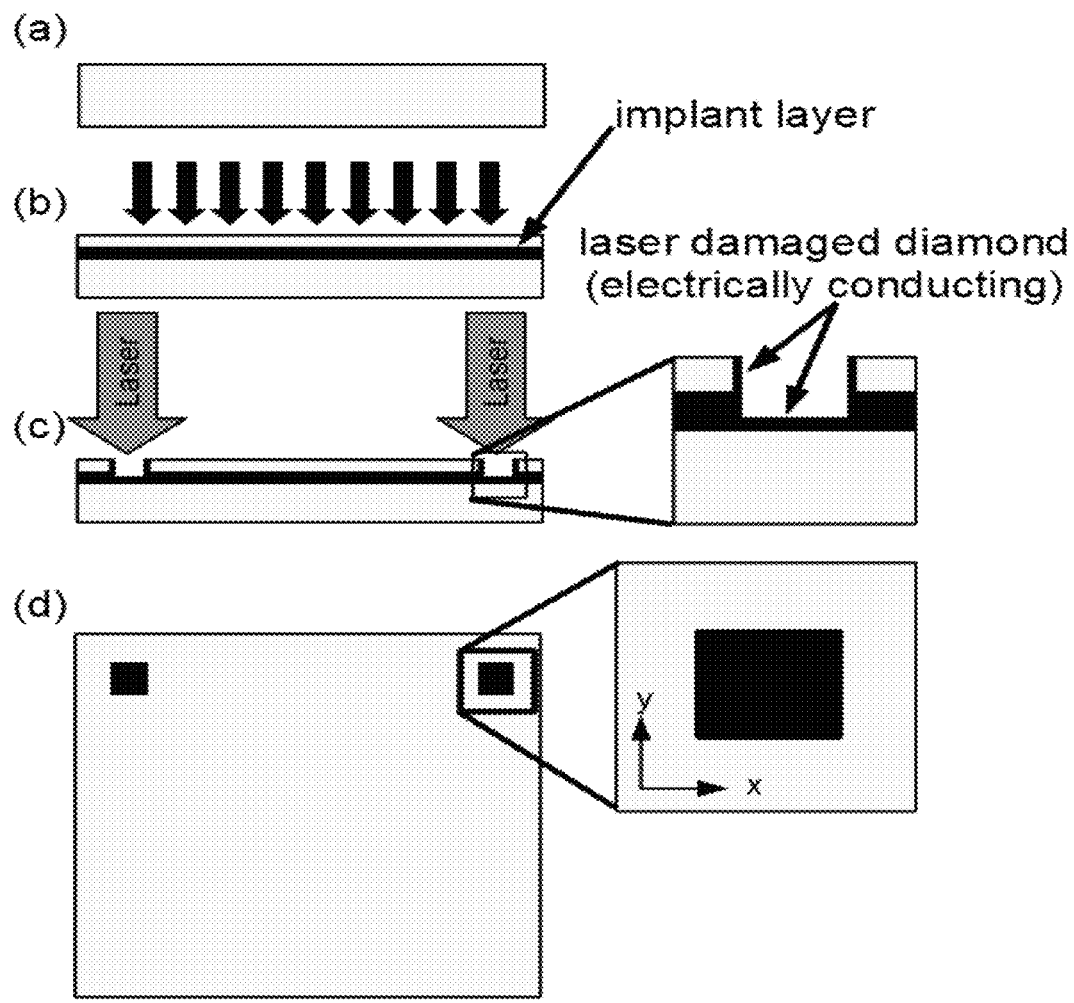
FIG. 1 is a process schematic for fabricating electrical contacts to a buried implant layer in diamond. Part (a) illustrates the polished diamond in cross section; Part (b) illustrates the implant process; Part (c) illustrates the fabrication of electrical contacts. Part (c) shows how the implant layer acts as an ablation stop providing access to the implant layer for electrical contact. Part (d) top view of the diamond showing the fabricated electrical contacts as black squares. The inset in part (d) shows the milled contact pad and the coordinate system used by the laser micro-machining system to raster the sample stage for milling the electrical contacts. Figure is not to scale.
Figure 3:
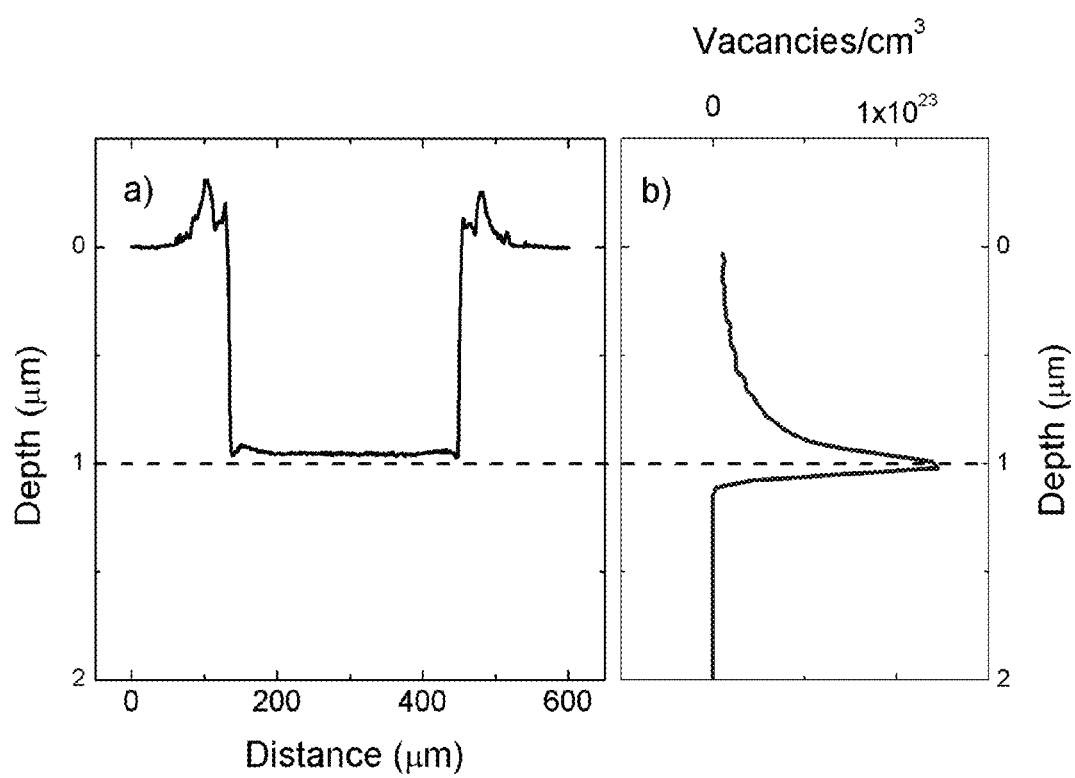
FIG. 3 illustrates: a) Surface profilometry of laser ablated electrical contact pad and b) Ion implant damage for (1.5

The milling routine translates the sample stage in a serpentine pattern at a linear speed of 5 mm/sec to mill out the opening (see the inset of FIG. 1 part (d)). Surface profile measurements find that the milled regions are at the same depth as predicted using a simulation after a single pass of the laser (see FIG. 3).

Figure 2:
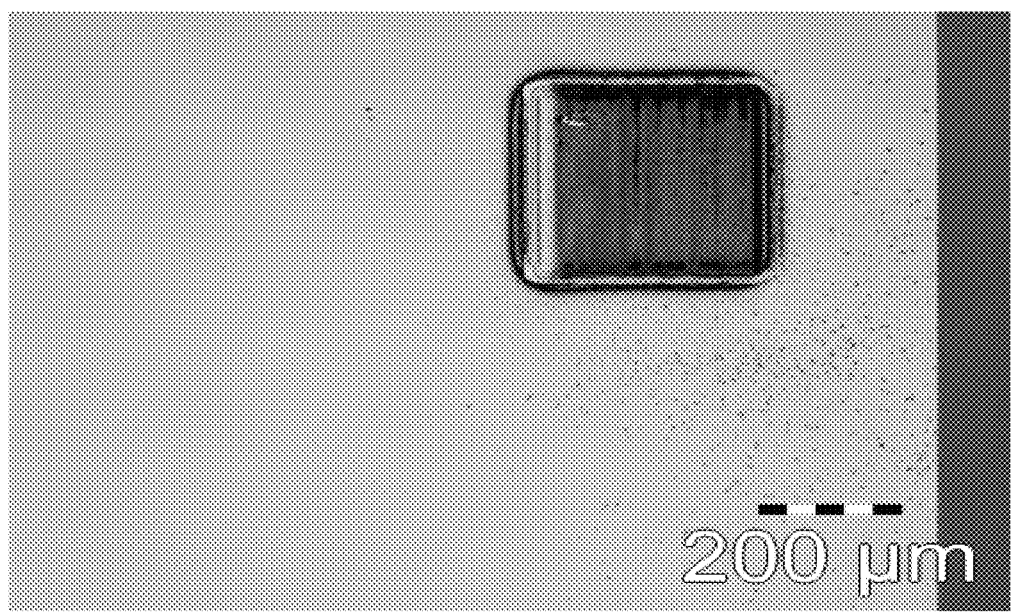
FIG. 2 illustrates an optical micrograph of a milled opening in the diamond skin by laser micro-machining. The milled area provides electrical contact to the buried implant layer as shown in FIG. 2. Ablated material from laser micro-machining is also observed.

After laser milling, a layer of opaque, electrically conducting, carbon covers the surface of the milled region (FIG. 2) and makes a reliable electrical contact to the conducting buried layer. A robust and facile electrical contact is made by metal evaporation over an area covering, but slightly larger than, the carburized laser-milled regions.

Current-voltage (I-V) measurements (Keithley 2400 SMU) determined the resistance from one contact pad to the other (see FIG. 4), from one contact pad to the diamond surface, and from separated points on the diamond surface. These measurements find linear I-V characteristics between contacts.

In contrast, measurements carried out between similarly separated tungsten point probe contacts on the diamond surface, or between a contact pad and tungsten point probe contact on the diamond surface, show dramatically higher resistance (>2 GΩ) at small applied fields, and non-linear behavior for larger bias voltage (inset of FIG. 4).

The results from the I-V characterization find that the resistance measured between the contact pads is dominated by the electrically conducting buried layer (~1 kΩ).

Several advantages of this invention are that the contact resistance to the buried layer is reduced. This laser ablation process is a facile, timesaving method to establish electrical contact to a buried, electrically conducting layer over a wide range of depths in an otherwise insulating diamond. For example, removal of 1 µm of diamond (see FIG. 3).

As discussed earlier, multiple ion implants into diamond, laser damage columns, and ion implant over gold beads are previously used methods. However, this invention described herein provides for superior results, for example, reduced contact resistance to the buried layer. Furthermore, this laser ablation process is a facile, timesaving method to establish electrical contact to a buried, electrically conducting layer in an otherwise insulating diamond.

The above examples are merely illustrative of several possible embodiments of various aspects of the present disclosure, wherein equivalent alterations and/or modifications will occur to others skilled in the art upon reading and understanding this specification and the annexed drawings. In addition, although a particular feature of the disclosure may have been illustrated and/or described with respect to only one of several implementations, such feature may be combined with one or more other features of the other implementations as may be desired and advantageous for any given or particular application. Also, to the extent that the terms "including", "includes", "having", "has", "with", or variants thereof are used in the detailed description and/or in the claims, such terms are intended to be inclusive in a manner similar to the term "comprising".

What we claim is:

1. A device comprising:
    a single crystal diamond substrate having a first carbon surface;
    an electrically conducting carbon layer beneath the first carbon surface formed by implanting the diamond with a beam of 180 KeV followed by 150 KeV C$^+$ ions at fluencies of 4×10$^{15}$ ions/cm$^2$ and 5×10$^{15}$ ions/cm$^2$ respectively; and
    a layer of ablated single crystal diamond wherein the layer lies between the electrically conducting layer and the first carbon surface.

2. The device of claim 1 wherein the layer of ablated single crystal diamond is formed using a diode pumped tripled Nd:YAG laser at 355 nm and wherein the laser pulse duration is about 35 ns with a pulse frequency of 10 kHz.

3. The device of claim 2 wherein the Nd:YAG laser is focused at about 0.5 mm above the first carbon surface.

4. The device of claim 3 wherein the laser is defocused to an about 9 µm diameter beam spot laser output pulses of 17 µJ.

5. The device of claim 4 wherein the implanting occurs at 7 degrees to the C(100) axis;
    wherein the electrically conducting carbon layer is about 50 nm beneath the first carbon surface; and
    wherein the electrically conducting carbon layer is about 200 nm thick.

6. The device of claim 5 wherein there is no damage at the first carbon surface.

7. The device of claim 6 further including an electrical contact to the electrically conducting carbon layer.

8. A device comprising:
a single crystal diamond substrate with a buried electrically conducting layer with two 300×300 μm square openings spaced about 2.45 mm apart milled into the diamond by ablating the carbon above wherein the step of ablating uses a diode pumped tripled Nd:YAG laser at 355 nm wherein the Nd:YAG laser was focused about 0.5 mm above the first carbon surface the defocusing to an about 9 μm diameter beam spot laser output pulses of 17 μJ wherein the laser pulse duration is about 35 ns with a pulse frequency of 10 kHz and wherein the square openings have electrical contacts and wherein the resistance measured between the square openings is dominated by the buried electrically conducting layer and on the order of about 1 kΩ.

* * * * *